United States Patent [19]
Yaezawa et al.

[11] Patent Number: 5,634,106
[45] Date of Patent: May 27, 1997

[54] POWER SAVING SYSTEM AND METHOD FOR REFRESHING A COMPUTER MEMORY BY SWITCHING BETWEEN INTERVAL REFRESH AND SELF-REFRESH OPERATIONS

[75] Inventors: Katsumi Yaezawa; Seiji Hinata, both of Kanagawa-ken, Japan

[73] Assignee: Kabushiki Kaisha Toshiba, Kanagawa-ken, Japan

[21] Appl. No.: 361,680

[22] Filed: Dec. 22, 1994

[30] Foreign Application Priority Data

Dec. 24, 1993 [JP] Japan .................................. 5-325517

[51] Int. Cl.⁶ .................................................. G06F 12/16
[52] U.S. Cl. ........................ 395/433; 395/750; 365/227
[58] Field of Search ........................ 395/433, 750, 395/431, 432, 550; 365/212, 222, 226, 227, 228; 364/483

[56] References Cited

U.S. PATENT DOCUMENTS

| | | | |
|---|---|---|---|
| 4,851,987 | 7/1989 | Day ............................... | 395/550 |
| 4,980,836 | 12/1990 | Carter et al. ................. | 364/483 |
| 4,982,369 | 1/1991 | Tatematsu ..................... | 365/222 |
| 5,262,998 | 11/1993 | Mnich et al. .................. | 365/222 |
| 5,278,797 | 1/1994 | Jeon et al. ..................... | 365/222 |
| 5,500,827 | 3/1996 | Yazdy et al. .................. | 365/222 |

*Primary Examiner*—Tod R. Swann
*Assistant Examiner*—Keith W. Saunders
*Attorney, Agent, or Firm*—Finnegan, Henderson, Farabow, Garrett & Dunner, L.L.P.

[57] ABSTRACT

A micro-computer system using a DRAM can refresh the DRAM in a certain interval cycle to maintain the memory contents or refresh the DRAM memory even when the system is set into the standby mode and the clock generator has stopped providing clock timing signals to the memory refreshing circuit. Accordingly, the DRAM memory is refreshed by automatically changing from the interval refresh mode to the self refresh mode when the system operation changes from the normal operation to the standby operation, thus achieving low system power consumption.

13 Claims, 5 Drawing Sheets

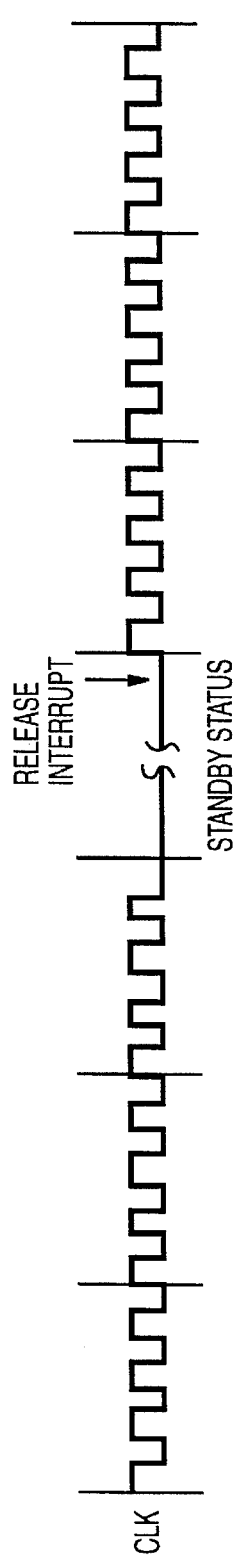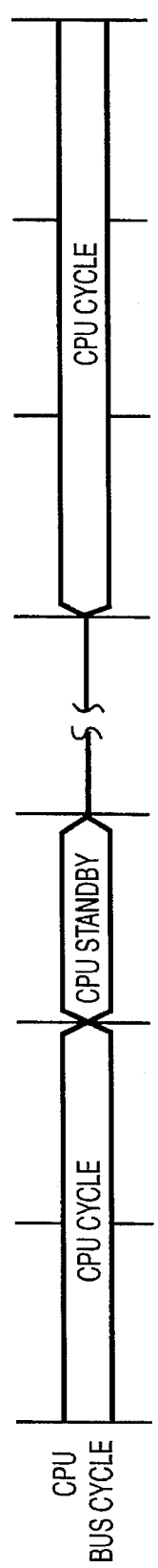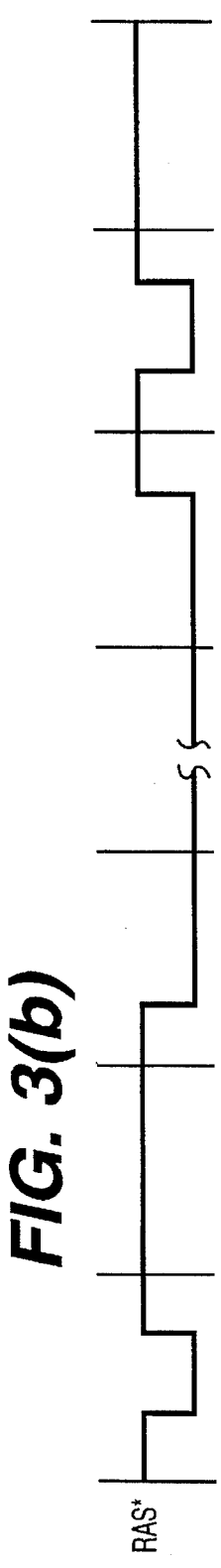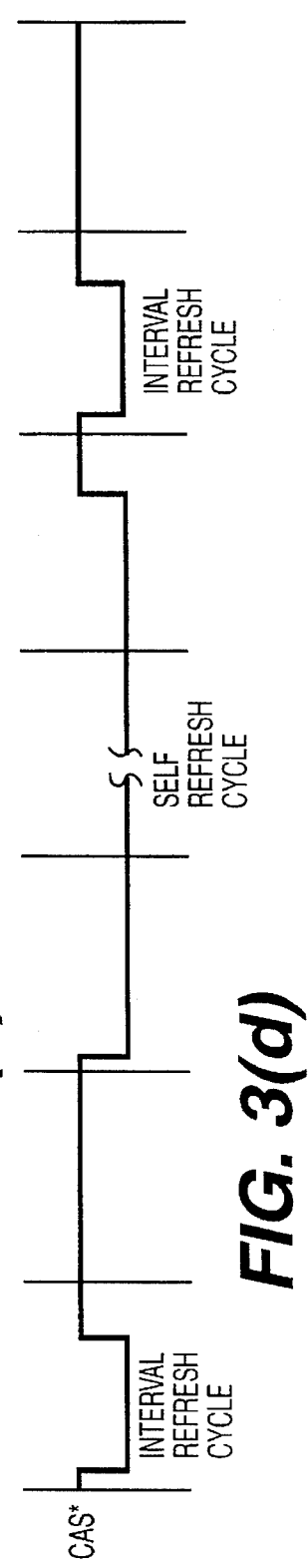

POWER SAVING SYSTEM AND METHOD FOR REFRESHING A COMPUTER MEMORY BY SWITCHING BETWEEN INTERVAL REFRESH AND SELF-REFRESH OPERATIONS

BACKGROUND OF THE INVENTION

1. Field of the Invention

This invention relates to a computer system using a memory which is required to be refreshed in a certain interval cycle.

This invention also relates to a method for refreshing a memory of a computer system in which the memory is required to be refreshed in a certain interval cycle.

More particularly, this invention relates to a computer system using a dynamic random access memory and a method for refreshing it while the system enters a standby operation mode.

Furthermore, and more particularly, the invention relates to a micro-computer system using a DRAM memory.

Furthermore, and more particularly this invention relates to a microcomputer system for a refreshing a DRAM by switching an interval or auto refresh mode and a self refresh mode.

2. Discussion of the Background

A computer system uses an outside memory device for storing data such as operational system programs. In particular, a micro-computer system, uses two kinds of memory devices. One is a static random access memory (hereinafter refers to as "SRAM") and the other is a dynamic random access memory (hereinafter referred to as "DRAM").

The SRAM can maintain its memory contents even when a clock generator in the system stops providing timing clock signals during a standby mode of system operation, as far as electric power is supplied to the system.

Because the ciock generator is one of the most electric power consuming devices in the system, it is beneficial, particularly for a small size computer, like a micro-computer system, to stop providing timinS clock signals during a standby mode of system operation.

Unfortunately, the SRAM is too expensive to use as a memory for a micro-computer system. So, the DRAM is usually used for a memory in a micro-computer system. However, to the SRAM, the DRAM is required to be refreshed in a certain interval cycle for storing memory contents.

Consequently, a computer system using a DRAM can not stop the clock generator because an interval memory refresh operation must be maintained.

This means that a system using a DRAM can never enter into a standby operation mode in order to save electric power consumption, even though this is required as a basic function of a small size computer system.

Furthermore, in a case of an instantaneous disconnection of an electric power source or a service interruption of an electric power supply, the same problem for destroying memory contents in a DRAM will appear because the memory refresh control circuit stops when a clock generator stops providing clock timing signals.

In order to prevent such problems, it is proposed to have a special clock generator for use only for memory refresh operation. However, this make the chip size larger, making mounting of the chip in a small size computer difficult.

Furthermore, this solution makes it basically impossible to achieve a low electric power consumption system since such a special clock generator also requires an electric power supply in order to provide clock signals for memory refresh operation even when a system enters to a standby mode.

Increasing noises also appears if a micro-computer system uses the plural clock generators. Because a clock generator oscillates a high frequency signal, it causes to become a noise source in a system. Accordingly, to provide plural clock generators increases such noise sources and it causes many bad influences for normal system operation.

SUMMARY OF THE INVENTION

Accordingly, it is an object of the invention to provide a computer system which can achieve a low electric power consumption while maintaining a memory refresh operation.

It is another object of this invention to provide a computer system which can maintain memory refresh operation even when the system enters to a standby mode causing the clock generator to stop providing clock signals.

It is still another object of this invention to provide a method for maintaining memory refresh operation even when the system enters a standby mode and a clock generator stops providing clock signals.

It is a further object of this invention to provide a micro-computer system which can achieve low electric power consumption while maintaining a memory refresh operation.

It is still a further object of this invention to provide a method for maintaining memory refresh operation of a micro-computer system even when the system enters a standby mode and a clock generator stops providing clock signals.

It is still another object of this invention to provide a computer system for maintaining memory refresh operation without providing a special clock generator for use only of the memory refresh operation but which can achieve the refresh operation when the system enters a standby mode.

It is still further object of this invention to provide a computer system which can achieve the memory refresh operation even when a clock generator stops its oscillation due to an instantaneous disconnection of the electric power supply or an electric service interruption.

It is still a further object of this invention to provide a computer system which can switch memory refresh operation modes in accordance with changes of system operation modes.

It is still further object of this invention to provide a micro-computer system which can switch memory refresh operation modes in accordance with changes of system operation modes.

It is still further object of this invention to provide a method for maintaining memory refresh operation by switching memory refresh operation modes in accordance with changes of system operation modes.

It is still further object of this invention to provide a method for maintaining a memory in a micro-computer system which maintains memory refresh operation by changing refresh modes in accordance with changes of system operation modes.

It is still another object of this invention to provide a computer system which can switch memory refresh operation modes by detecting changes of system operation modes.

The computer system includes a CPU for providing system operation control signals including normal mode operation instruction and standby mode operation instruction signals, a memory device for storing memory contents requiring refreshing at a certain interval cycle, a clock generator for supplying clock timing signals to elements of the system including the CPU, a memory control means for providing memory operation control signals including at least two kinds of memory refresh instruction signals to the memory device in accordance with the normal mode and standby mode operation instruction signals from the CPU, and a memory refreshing means for refreshing the memory device in accordance with the refresh instruction signals from the memory control means.

And the memory refresh means executes an interval refresh operation of the memory device while the CPU provides the normal operation mode instruction signal to the memory control means.

And also the memory refresh means executes a self-refresh operation of the memory device when the CPU provides the standby mode instruction signal to the memory control means and the memory control means instructs the memory refresh means to change memory refresh operation.

Then the clock generating means stops to supply the clock timing signals to the system elements when the memory device enters to the self-refresh operation.

BRIEF EXPLANATION OF THE DRAWINGS

FIG. 3(a) is a timing diagram showing clock timing signals from the clock generator.

FIG. 3(b) is a timing diagram showing a CPU bus cycle.

FIG. 3(c) is a timing diagram showing a RAS* signal.

FIG. 3(d) is a timing diagram showing a CAS* signal.

DETAILED EXPLANATION OF THE PREFERABLE EMBODIMENT OF THE INVENTION

Now referring to figures, the preferable embodiments of the present invention will be explained.

Figure 1:
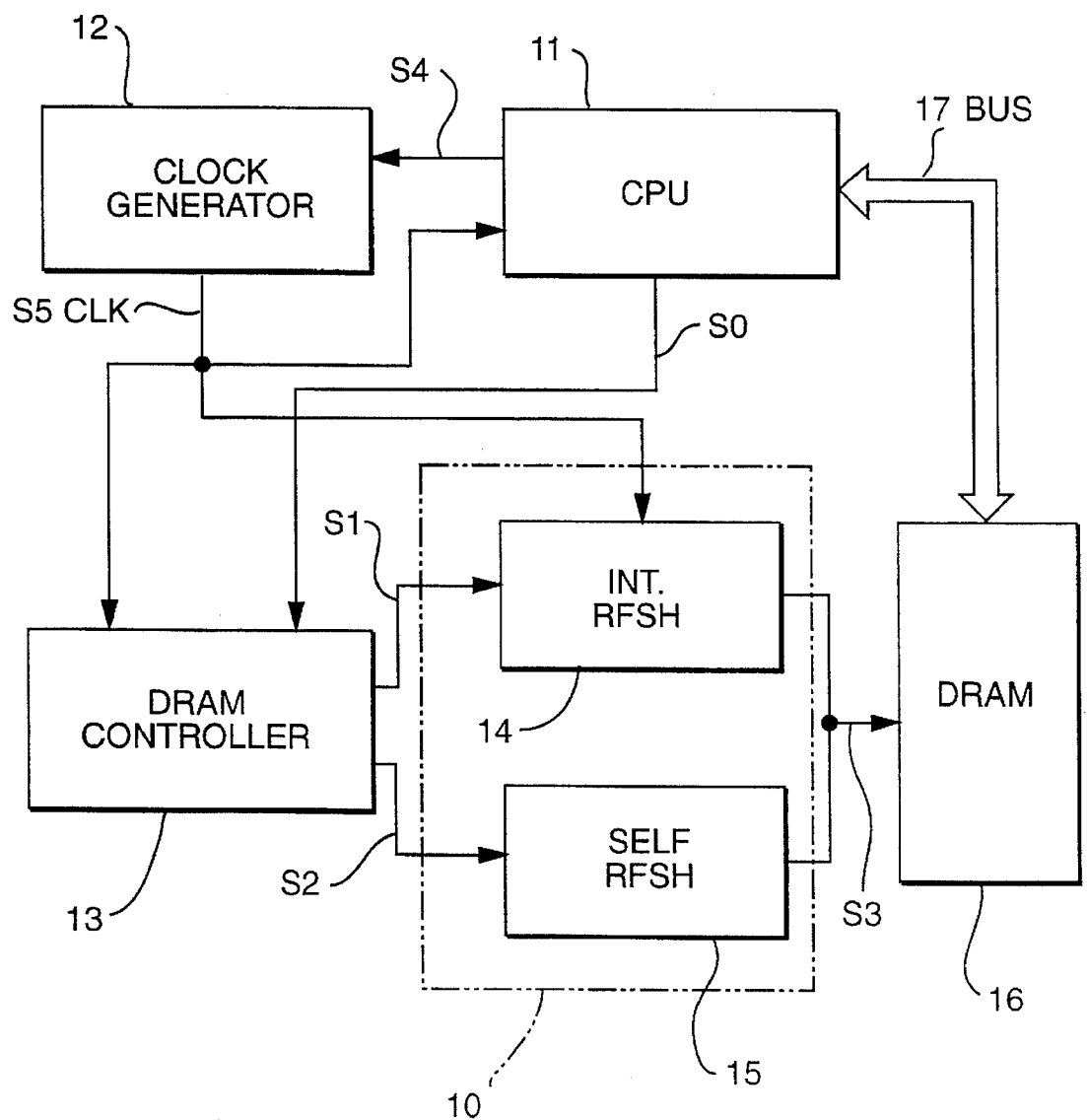
FIG. 1 is a schematic diagram of the construction of the preferred embodiment of the microcomputer system.

FIG. 1 shows a schematic diagram of the construction of the preferable embodiment of the computer system according to the invention.

As mentioned before, a DRAM memory is usually used in a micro-computer system. The DRAM is required to be refreshed at certain interval cycles for storing memory contents.

There are several kinds of memory refresh operations. For convenience, the memory refresh operation for the preferred embodiment uses a so-called CAS* before RAS* memory refresh.

As shown in FIG. 1, the computer system includes a CPU 11, a clock generator 12, a memory control means 13, a memory refreshing means 10 and a memory means 16 which needs to be refreshed at certain interval cycles for storing memory contents.

The CPU 11 provides many control signals for controlling system operations. In particular, the CPU 11 provides instruction signals of system operation modes to elements of the system including a memory controller 13. The CPU 11 communicates with clock generator 12 through signal line 54.

The system operation modes are a normal operation mode and a standby mode. During standby mode of the system, a clock generator 12 stops providing clock signals S5 to elements of the system in order to save electric power consumption.

The memory controllot 13 receives clock timing signals from the clock generator 12 and a system mode instructin signal S0 from the CPU.

The memory controllor 13 provides memory operation control signals including first and second memory refresh instruction signals S1 and S2 to the memory refreshing means 10 in response to the normal mode and standby mode of operation instruction signals from the CPU.

The memory refreshing means 10 provides a CAS* before RAS* memory refresh signal S3 to the memory means 16.

The memory 16 is coupled to the CPU through a bus 17 for transmitting read/write data between them.

The memory refreshing means 10 is constructed so as to operate two different kinds of memory refreshing operation modes.

One is an interval refreshing means 14 for executing an interval refresh operation of the memory device 16 periodically in accordance with the clock timing signals while the CPU 11 provides the normal operation mode instruction signal S0 to the memory control means 13.

The other is a self refreshing means 15 for executing a self refresh operation of the memory device 16 when the CPU 11 provides the standby mode instruction signal S0' to the memory control means 13 in order to enter a standby mode of the system operation and to stop oscillation of the clock generator 12.

As explained before, in the preferred embodiment, the memory device 16 is a dynamic random access memory (DRAM) and the memory refreshing means 10 provides a memory refresh instruction signal S3 which is comprised of RAS*(row address strobe) before CAS*(column address strobe) signals to the DRAM 16. The attached symbol "*" to the signal indicates negative logic.

FIGS. 2, 3(a), 3(b), 3(c), and 3(d) explain how to switch the memory refresh mode from the interval refresh mode to the self-refresh mode.

Figure 2:
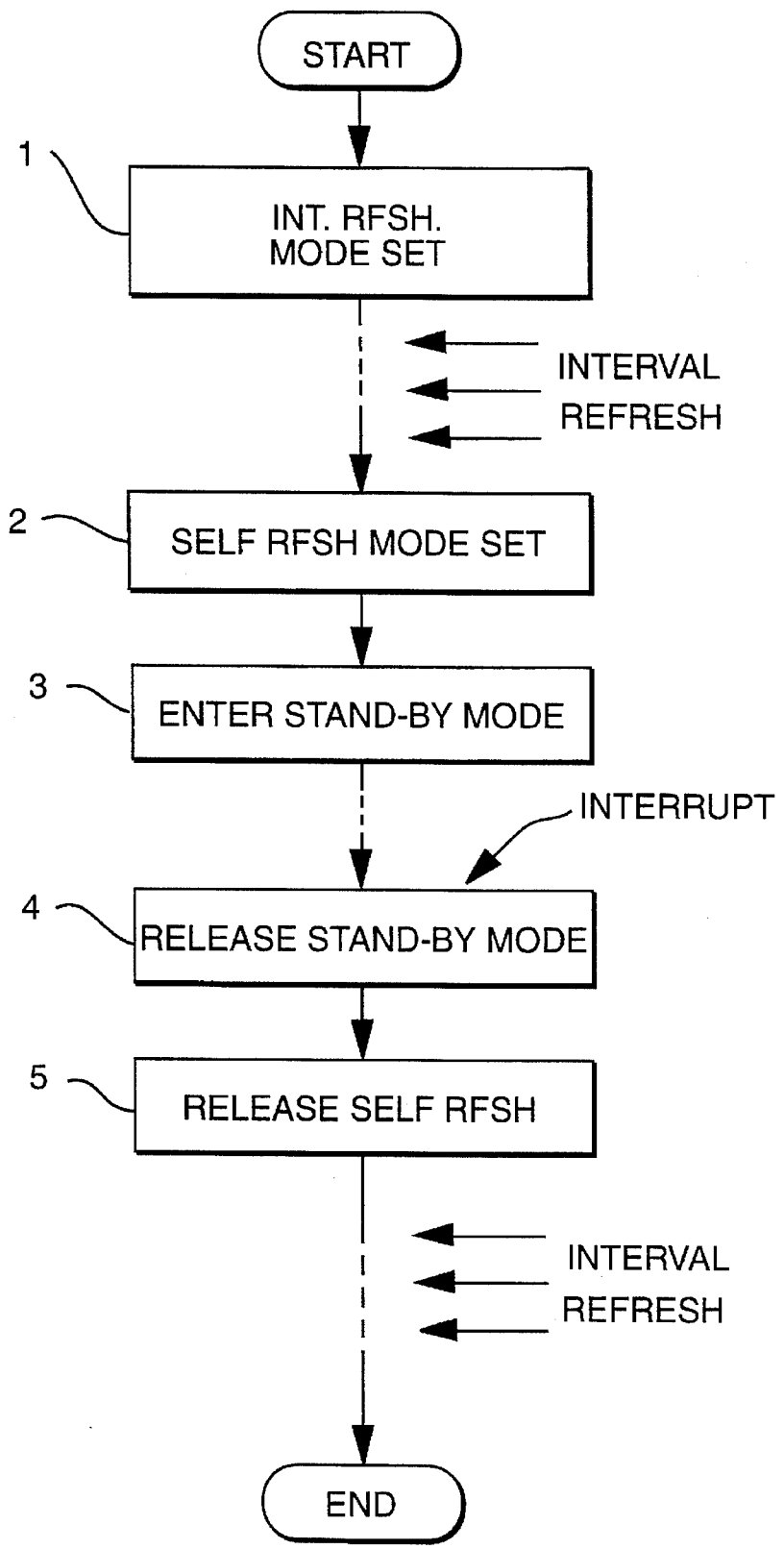
FIG. 2 is a flow chart for explaining a programmable switch operation of the memory refresh mode.

FIG. 2 is a flow chart for explaining the refresh mode switching. FIGS. 3(a), 3(b), 3(c), and 3(d) is a timing chart of the memory refresh operation.

At step 1 in FIG. 2, the memory controller provides an interval refresh signal to the memory refreshing means when the CPU instructs the system operation to be in the normal mode.

The memory refreshing means operates as an interval refreshing means 14 with the interval refresh mode set instruction signal S1 and clock timing signals S5 in order to execute the interval refresh operation of the memory device periodically.

The DRAM memory device can recognize the interval refresh operation by a transition of both of the CAS and RAS signals simultaneously from a low level to a high level at a predetermined time interval in accordance with the timing signals from the clock generator, as shown in FIGS. 3(a), 3(b), 3(c), and 3(d).

When the system operation enters a standby mode, the CPU firstly provides a self-refresh mode set instruction signal to the DRAM controller, as shown at the step 2 in FIG. 2. Then, the CPU enters standby mode, step 3.

The DRAM controllor provides an instruction signal for entering self refresh mode to the memory refreshing means. In response to the instruction signal, the memory refreshing means switches its function from the interval refresh mode to the self refresh mode and executes the self refresh operation.

The DRAM memory device recognizes that the system enters to the standby status and memory refresh operation enters to the self refresh cycle when both of the CAS and RAS signals are simultaneously at a low level over a predetermined pulse rise time as shown in FIGS. 3(a), 3(b), 3(c), and 3(d).

As explained above, the DRAM recognizes the memory refresh mode switch between the interval refresh mode and the self refresh mode by the timing of pulse rises of the CAS and RAS signals.

In order to go back to the normal mode of the system operation, an interrupt signal is supplied to the CPU from the outside, then the CPU provides the instruction signal to the DRAM controller for setting to release the mode, as shown at step 4 in FIG. 2.

The DRAM controller switches the memory refresh mode from the self refresh mode to the interval refesh mode. Then the DRAM memory is released from the self refresh mode and goes back to the interval refresh mode. Thus, as shown in FIGS. 2 and 3, the interval refresh always proceeds and follows the self refresh mode.

As explained in FIG. 2, the switch of the memory refresh mode is programmably controlled.

Figure 4:
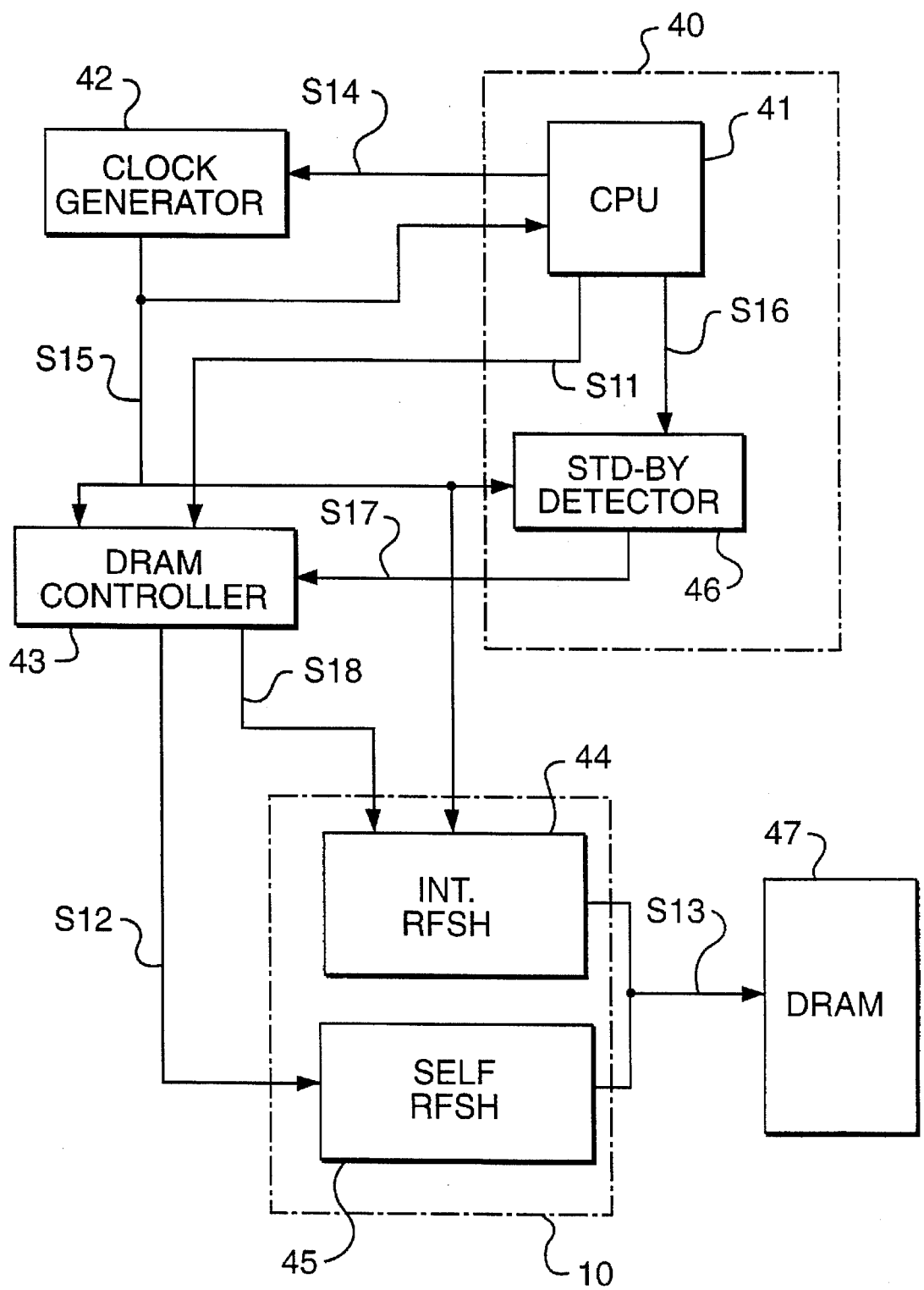
FIG. 4 is a schematic diagram showing the construction of another embodiment of the computer system.

FIG. 4 depicts another embodiment of the invention for achieving the memory refresh mode switch by providing a special hardware for detecting the standby mode of the system operation.

In this embodiment, a standby mode detector 46 is provided for detecting the standby mode instruction signal S16 from the CPU 41.

When the system is the normal mode, the CPU 41 provides a normal mode instruction signal Sll to the DRAM controllot 43. The DRAM controller 43 provides a first memory refresh instruction signal S18 in accordance with clock timing signal S15 from the clock generator 42.

The CPU 41 communicates with clock generator 42 through line S14.

The first memory refresh instruction signal S18 provided to the interval refresh circuit 44 in the memory refreshing means.

When the CPU 41 provides a standby mode instruction signal S16 to the standby mode detector 46, it also provides a mode switching signal S17 to the DRAM controller 43.

Then the DRAM controller switches the function of the memory refreshing means to a self refreshing circuit 45 by changing to provide a second memory refresh instruction signal S12.

Figure 5:
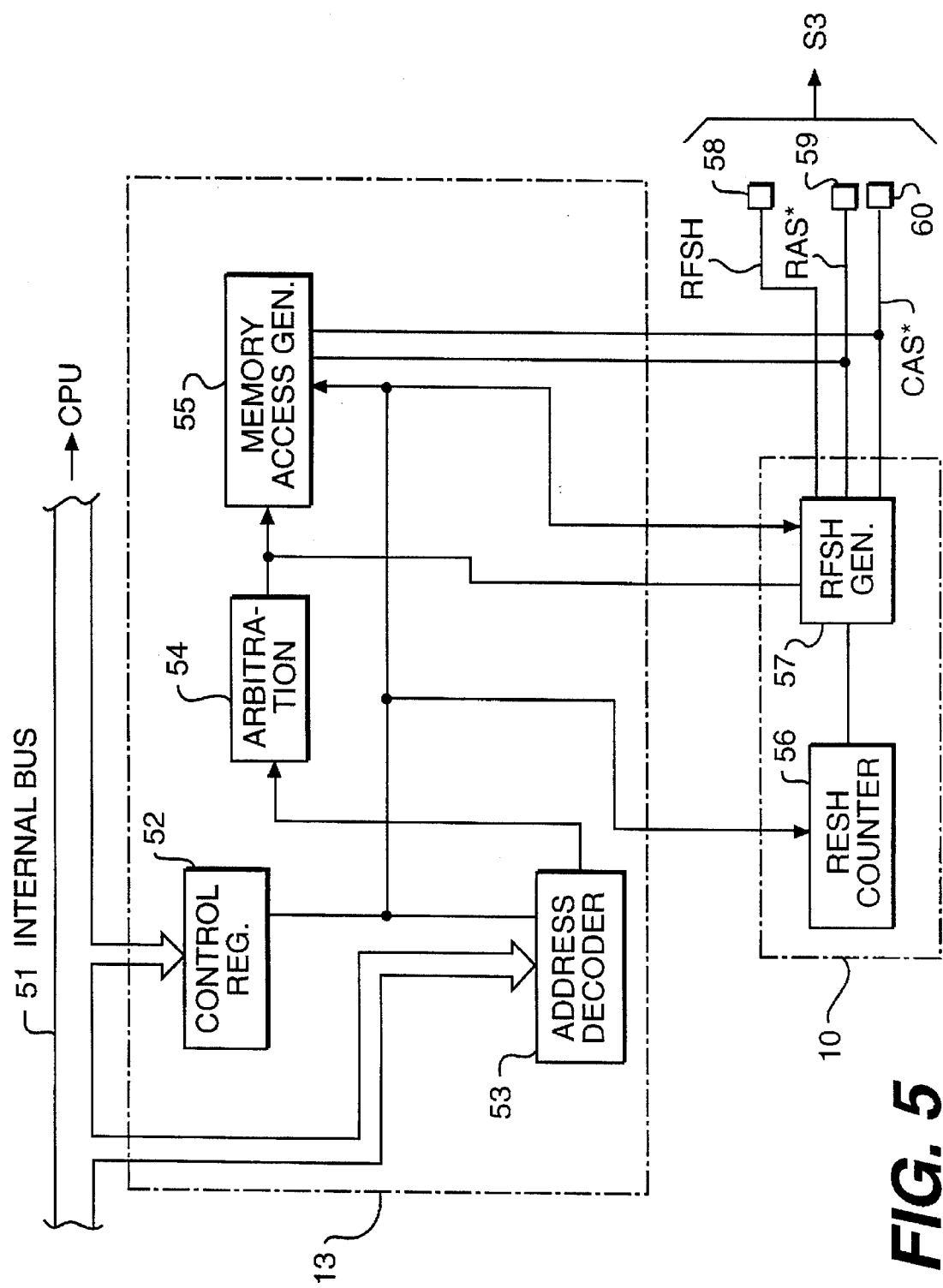
FIG. 5 is a block diagram showing a detailed construction of the DRAM controller and the memory refreshing means.

FIG. 5 shows a detail construction of the embodiment of the DRAM controller 13 and the memory refreshing means 10 in FIGS. 1 and 4.

As shown in this figure, the DRAM controller 13 includes a control register 52, an address decoder 53, arbitration circuit 54, and a memory access generator 55.

The control resister 52 and the address decoder 53 are coupled to an internal bus 51 in order to receive control signals and address data from the CPU.

The memory address decoded by the address decoder 53 is supplied to the memory access generator 55.

The control register 52 provides a control signal to the refresh counter 56 and a refresh generator 57 in the memory refreshing means 10.

The memory refreshing means 10 is comprised of a refresh counter 56 and a refresh generator 57.

The refresh counter 56 decides the pulse rise timing of the memory refresh signals of the RAS* and CAS* which are supplied from the refresh generator 57 through the respective refresh terminal 58, RAS* terminal 59 and CAS* terminal 60 to the DRAM.

As mentioned above, according to this invention, when the system is set into the standby mode, the DRAM is refreshed by the self refresh mode without providing clock signals. Consequently, a low power consumption can be achieved while keeping the memory refresh operation.

What is claimed is:

1. A computer system comprising:

a CPU for providing system operation control signals including normal mode operation instruction and standby mode operation instruction signals;

a memory device for storing memory contents, the memory device requiring refreshing at a certain interval cycle;

a clock generator for supplying clock timing signals to elements of the system, including the CPU, the clock generator stopping the supply of clock timing signals when the CPU provides the standby mode instruction signal;

a memory control means for providing memory operation control signals including at least two kinds of memory refresh instruction signals, one of the kinds of memory refresh instruction signals being an interval refresh signal, to the memory device in accordance with the normal mode and standby mode operation instruction signals from the CPU, the memory control means providing a single first interval refresh signal to the memory device just before the time when the CPU changes from providing the normal mode operation instruction signal to the standby mode operation instruction signal and a single second interval refresh signal provided to the memory device just after the time when the CPU changes from providing the standby mode operation instruction signal to the normal mode operation instruction signal;

an interval refreshing means for executing an interval refresh operation of the memory device periodically in accordance with the clock timing signals while the CPU is providing the normal operation mode instruction signal to the memory control means; and a self-refreshing means for executing a self refresh operation of the memory device when the CPU provides the standby mode instruction signal to the memory control means in order to enter a standby mode of system operation.

2. The computer system according to claim 1, wherein said memory device is a DRAM which has means for discriminating the instruction change between the interval refresh operation and the self-refresh operation and the memory control means is a DRAM controller.

3. A computer system comprising:

a CPU for providing system operation control signals including normal mode operation instruction and standby mode operation instruction signals;

a memory device for storing memory contents, the memory device requiring refreshing at a certain interval cycle;

a clock generator for supplying clock timing signals to elements of the system including the CPU, a memory control means for providing memory operation control signals including at least two kinds of memory refresh instruction signals, one of the kinds of memory refresh instruction signals being an interval refresh instruction signal, to the memory device in accordance with the normal mode and standby mode operation instruction signals from the CPU, the memory control means providing a single first interval refresh signal to the memory device just before the time when the CPU changes from providing the normal mode operation instruction signal to the standby mode operation instruction signal and a single second interval refresh signal provided to the memory device just after the time when the CPU changes from providing the standby mode operation instruction signal to the normal mode operation instruction signal; and a memory refreshing means for refreshing the memory device in accordance with the refresh instruction signals from the memory control means, wherein the memory refresh means executes an interval refresh operation of the memory device while the CPU provides the normal operation mode instruction signal to the memory control means and the memory refresh means executes a self-refresh operation of the memory device when the CPU provides the standby mode instruction signal to the memory control means and the memory control means instructs the memory refresh means to change memory refresh operation;

wherein the clock generator stops supplying the clock timing signals to system elements when the memory device enters the self-refresh operation.

4. The computer system according to claim 3, wherein said memory device is a DRAM which has means for discriminating the instruction change between the interval refresh operation and the self-refresh operation, and the memory control means is a DRAM controllor.

5. The computer system according to claim 3, wherein said memory refreshing means comprises:

a refresh count means for counting refresh intervals in accordance with the memory refresh instruction signals from the memory control means; and a refresh generator for proving memory refresh execution signals to the memory device in accordance with an output signal of the refresh count means.

6. The computer system according to claim 4, wherein the memory refreshing means provides CAS before RAS signals to the DRAM, and the DRAM enters the self refresh operation when the CAS and RAS signals are at a low level over a predetermined pulse rise time.

7. The computer system according to claim 3 or 4, wherein during the interval refresh operation said memory refreshing means provides for a transition of CAS and RAS signals simultaneously from a low level to a high level after a predetermined time interval, the predetermined time interval beginning with the start of the supplying of the timing signals from the clock generator.

8. A computer system comprising:

a CPU for providing system operation control signals including normal mode operation instruction and standby mode operation instruction signals;

a memory device for storing memory contents, the memory device requiring refreshing at a certain interval cycle;

a clock generator for supplying clock timing signals to elements of the system, including the CPU, the clock generator ceasing to supply the timing signals when the system enters a standby mode of operation;

a memory control means for providing memory operation control signals including first and second memory refresh instruction signals, the first memory refresh instruction signal being an interval refresh signal, in response to the normal mode and standby mode operation instruction signals, respectively, the memory control means providing a single first interval refresh signal to the memory device just before the time when the CPU changes from providing the normal mode operation instruction signal to the standby mode operation instruction signal and a single second interval refresh signal provided to the memory device just after the time when the CPU changes from providing the standby mode operation instruction signal to the normal mode operation instruction signal;

a standby mode detector for providing a refresh mode change instruction signal to the memory control means in response to the standby mode operation instruction signal, an interval refreshing means for executing an interval refresh operation of the memory device periodically in accordance with the first refresh instruction signal, and a self-refreshing means for executing a self refresh operation of the memory device in accordance with the second refresh instruction signal during the standby mode of system operation.

9. A micro-computer system comprising:

a DRAM memory requiring refreshing at a certain cycle to maintain its memory contents;

a CPU for providing system operation instruction signals including normal operation mode and standby operation mode instruction signals;

a clock generator for supplying clock signals to components of the system, including the CPU;

a memory control means for providing memory operation control signals including two kinds of memory refresh signals, one of the kinds of memory refresh instruction signal being an interval refresh signal, to the DRAM memory in accordance with the system operation instruction signals, the memory control means providing a single first interval refresh signal to the DRAM memory just before the time when the CPU changes from providing the normal mode operation instruction signal to the standby mode operation instruction signal and a single second interval refresh signal to the DRAM memory just after the time when the CPU changes from providing the standby mode operation instruction signal to the normal mode operation instruction signal;

a detecting means for detecting the standby operation mode signal from the CPU and sending a self refresh operation instruction signal to the memory control means; and a memory refresh means for refreshing the DRAM memory in accordance with the refresh control signal from the memory control means;

wherein, the memory refresh means executes an interval refresh operation of the DRAM memory when the CPU provides the normal operation mode instruction signal, the memory refresh means executes a self-refresh operation of the DRAM memory when the CPU provides the standby operation mode instruction signal, and the CPU sends a stop signal to the clock generator when the DRAM memory enters self-refresh operation.

10. The micro-computer system according to claim 9, wherein said DRAM memory includes means for discriminating a change of the memory refresh means to the self-refresh operation; and the memory control means is a DRAM controllor.

11. The micro-computer system according to claim 9, wherein said memory refresh means executes a refresh operation by generating a CAS signal before an RAS signal.

12. The micro-computer system according to claim 11, wherein said memory refresh means executes the interval refresh operation of the DRAM memory by raising the CAS and RAS signals from a low level to a high level at a predetermined time interval while the CPU provides the normal operation mode instruction signal.

13. The micro-computer system according to claim 11, wherein said memory refresh means executes the self refresh operation of the memory device by keeping the CAS and RAS signals at a low level for more than a predetermined time interval while the CPU provides the standby operation mode instruction signal.

* * * * *